(12) United States Patent
Chen et al.

(10) Patent No.: US 10,685,911 B2
(45) Date of Patent: Jun. 16, 2020

(54) SEMICONDUCTOR PACKAGE AND MANUFACTURING METHOD OF THE SAME

(71) Applicant: TAIWAN SEMICONDUCTOR MANUFACTURING COMPANY LTD., Hsinchu (TW)

(72) Inventors: Ming-Fa Chen, Taichung (TW); Sung-Feng Yeh, Taipei (TW); Chen-Hua Yu, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 88 days.

(21) Appl. No.: 15/198,408

(22) Filed: Jun. 30, 2016

(65) Prior Publication Data

US 2018/0005940 A1 Jan. 4, 2018

(51) Int. Cl.
*H01L 23/00* (2006.01)
*H01L 23/522* (2006.01)
(Continued)

(52) U.S. Cl.
CPC .... *H01L 23/5226* (2013.01); *H01L 21/76877* (2013.01); *H01L 23/5283* (2013.01);
(Continued)

(58) Field of Classification Search
CPC ... H01L 21/76877; H01L 25/50; H01L 25/16; H01L 24/09; H01L 23/5283; H01L 23/5226; H01L 25/0657; H01L 2224/11; H01L 2924/1206; H01L 24/13; H01L 2224/13101; H01L 2225/06548; H01L 21/76898; H01L 2224/131; H01L 2924/014; H01L 2924/00014; H01L 24/08; H01L 24/32; H01L 24/80; H01L 24/83; H01L 2224/02166; H01L 2224/08145;
(Continued)

(56) References Cited

U.S. PATENT DOCUMENTS 7,564,115 B2   7/2009  Chen et al.
7,633,165 B2   12/2009 Hsu et al.
(Continued)

OTHER PUBLICATIONS

Merriam-Webster OnLine definition of "interface." No date!*

*Primary Examiner* — Hrayr A Sayadian
(74) *Attorney, Agent, or Firm* — WPAT, P.C., Intellectual Property Attorneys; Anthony King

(57) ABSTRACT

The present disclosure provides a semiconductor package, including a first semiconductor structure, a first bonding dielectric over the first semiconductor structure and surrounding a first bonding metallization structure, a through via over the first bonding dielectric, and a passive device passive device electrically coupled to the through via and the first bonding metallization structure. The present disclosure also provides a method for manufacturing a semiconductor package, including providing a first die, bonding a second die with the first die, wherein the second die partially covers the first die thereby forming a gap over an uncovered portion of the first die, filling the gap over the first die with dielectric, forming a through dielectric via (TDV) in the filled gap, and forming a passive device over the second die and the TDV.

20 Claims, 17 Drawing Sheets

(51) Int. Cl.
*H01L 21/768* (2006.01)
*H01L 23/528* (2006.01)
*H01L 25/065* (2006.01)
*H01L 25/16* (2006.01)
*H01L 25/00* (2006.01)

(52) U.S. Cl.
CPC .......... *H01L 24/09* (2013.01); *H01L 25/0657* (2013.01); *H01L 25/16* (2013.01); *H01L 25/50* (2013.01); *H01L 21/76898* (2013.01); *H01L 24/08* (2013.01); *H01L 24/13* (2013.01); *H01L 24/32* (2013.01); *H01L 24/80* (2013.01); *H01L 24/83* (2013.01); *H01L 2224/02166* (2013.01); *H01L 2224/08145* (2013.01); *H01L 2224/11* (2013.01); *H01L 2224/13101* (2013.01); *H01L 2224/32145* (2013.01); *H01L 2224/80895* (2013.01); *H01L 2224/83896* (2013.01); *H01L 2225/06548* (2013.01); *H01L 2924/00014* (2013.01); *H01L 2924/1206* (2013.01); *H01L 2924/1304* (2013.01); *H01L 2924/3511* (2013.01)

(58) Field of Classification Search
CPC . H01L 2224/32145; H01L 2224/80895; H01L 2224/83896; H01L 2924/1304; H01L 2924/3511
USPC ........................................................ 257/531
See application file for complete search history.

(56) References Cited

U.S. PATENT DOCUMENTS

| | | |
|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,448,100 B1 | 5/2013 | Lin et al. |
| 8,631,372 B2 | 1/2014 | Yu et al. |
| 8,669,174 B2 | 3/2014 | Wu et al. |
| 8,669,780 B2 | 3/2014 | Chi |
| 8,701,073 B1 | 4/2014 | Fu et al. |
| 8,754,818 B2 | 6/2014 | Yen et al. |
| 8,802,504 B1 | 8/2014 | Hou et al. |
| 8,803,292 B2 | 8/2014 | Chen et al. |
| 8,803,316 B2 | 8/2014 | Lin et al. |
| 8,896,094 B2 | 11/2014 | Yen et al. |
| 9,016,939 B2 | 4/2015 | Chang et al. |
| 9,086,452 B2 | 7/2015 | Wang et al. |
| 9,165,968 B2 | 10/2015 | Chao et al. |
| 9,171,798 B2 | 10/2015 | Lin et al. |
| 9,172,242 B2 | 10/2015 | Chang et al. |
| 9,219,038 B2 | 12/2015 | Horng et al. |
| 2013/0193981 A1 | 8/2013 | Chen et al. |
| 2013/0246990 A1 | 9/2013 | Yen et al. |
| 2013/0320553 A1 | 12/2013 | Kuo et al. |
| 2014/0001645 A1 | 1/2014 | Lin et al. |
| 2014/0126274 A1 | 5/2014 | Lee et al. |
| 2014/0167799 A1 | 6/2014 | Wang et al. |
| 2014/0195728 A1 | 7/2014 | Hsu et al. |
| 2014/0225258 A1 | 8/2014 | Chiu et al. |
| 2014/0239427 A1 | 8/2014 | Huang et al. |
| 2014/0252572 A1 | 9/2014 | Hou et al. |
| 2014/0266273 A1 | 9/2014 | Wang et al. |
| 2015/0287697 A1 | 10/2015 | Tsai et al. |
| 2015/0348872 A1 | 12/2015 | Kuo et al. |
| 2018/0005940 A1* | 1/2018 | Chen ................ H01L 21/76877 |

* cited by examiner

SEMICONDUCTOR PACKAGE AND MANUFACTURING METHOD OF THE SAME

BACKGROUND

Semiconductor devices are used in a variety of electronic applications, such as personal computers, cell phones, digital cameras, and other electronic equipment. The fabrication of semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, that utilize less area or smaller heights, are developed to package the semiconductor devices. For example, in an attempt to further increase circuit density, three-dimensional (3D) ICs have been investigated.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
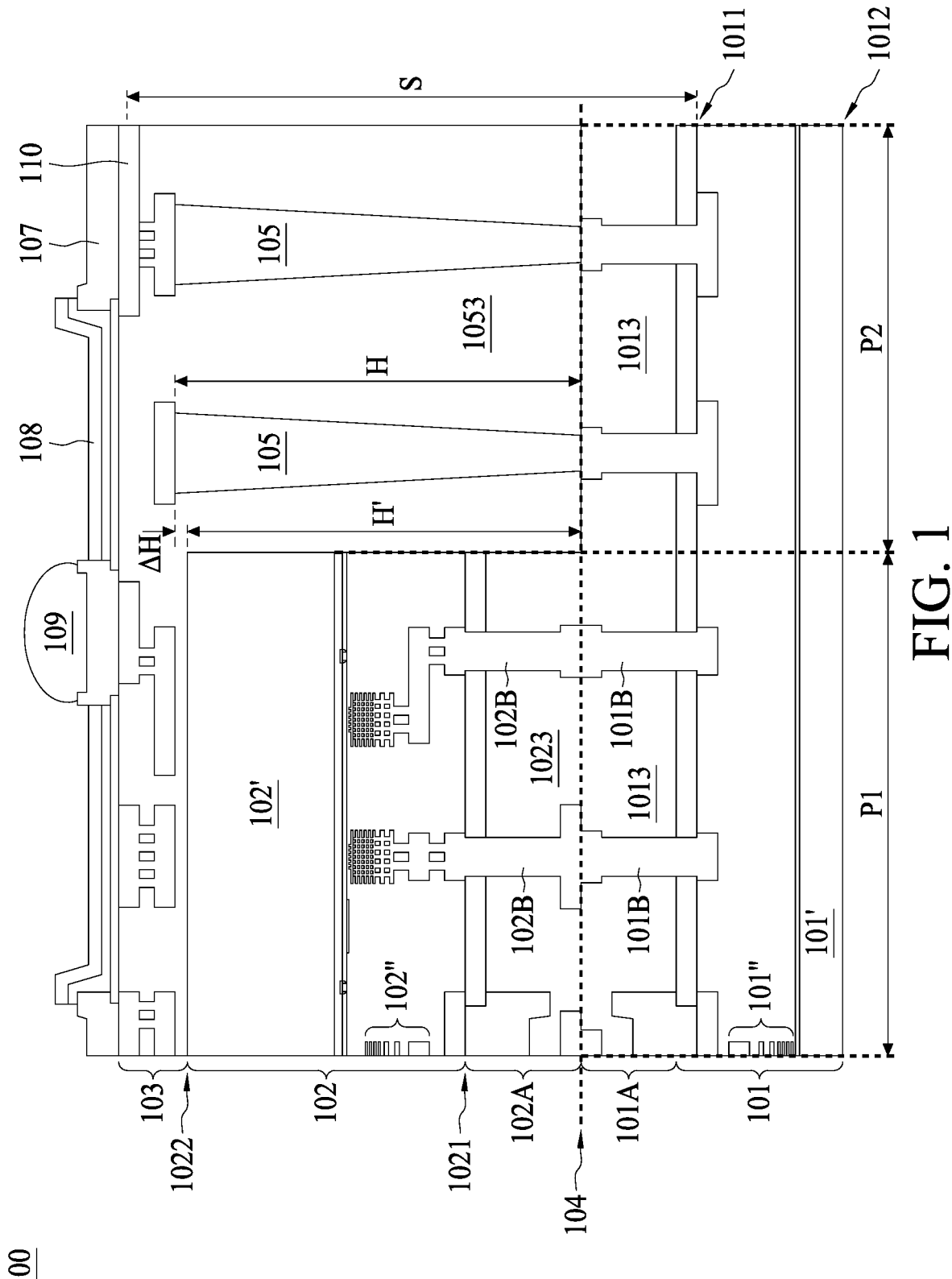
FIG. 1 is a cross sectional view of a semiconductor package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Various embodiments include methods and corresponding structures for forming a semiconductor device package. Various embodiments integrate multiple functional chips in a single device package and implements Chip-to-Wafer (e.g., known good die) for Chip-on-Wafer (CoW) level packaging. Functional chips may be directly bonded to other functional chips using bonding layers (e.g., by fusion bonding and/or hybrid bonding) in order to reduce the need to form solder bumps (e.g., microbumps) and underfill. Various embodiments may further advantageously provide a system-in-package (SiP) solution with smaller form factor, increased input/output density, and low via aspect ratio. Thus, manufacturing errors and costs can be reduced.

Conventionally an integrated passive device (IPD) such as an inductor or a capacitor is integrated at the top several metal layers at the metallization structure of a semiconductor chip, resulting the device region under the direct projection of the IPD and said region proximity cannot be implemented with active devices such as transistors or memories. In other words, the layout of the IPD substantially limits the active device real estate due to the fact that the induced current generated by the IPD could unduly affect the performance of the underlying active devices. In some cases, not only the direct projection under the IPD but also a circumference of about 15 micrometer of said direct projection are deliberately reserved for not laying out any active devices. This causes approximately 10% to 20% of the total device area to be consumed by the IPD and keeps the form factor high.

On the other hand, as semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

The present disclosure provides a multi-chip semiconductor package or a 3DIC package that entails at least one IPD. The IPD is positioned in the multi-chip semiconductor package without limiting any of the active device real estate and without causing any adversary effect to the performance of the active devices. Therefore, the form factor of the chips in the multi-chip semiconductor package is reduced, lowering the manufacturing cost per unit area of the chip.

Referring to FIG. 1, FIG. 1 is a cross sectional view of a semiconductor package 100, in accordance with some embodiments of the present disclosure. The semiconductor package 100 includes a semiconductor structure 101 and another semiconductor structure 102. The semiconductor structure 101 has a substrate portion 101' and a metallization portion 101" including interconnect structures extending from an active region 101''' in the substrate portion 101', which applies to other embodiments in the present disclosure. The active region 101''', in some embodiments, contains various active devices (not illustrated) such as transistors, capacitors, resistors, diodes, photo-diodes, fuses. Interconnect structures may be formed over the active devices. The term "face" or "front" surface or side is a term used herein implying the major surface of the device upon which active devices and interconnect layers are formed. Likewise, the "back" surface of a die is that major surface opposite to the face or front. As shown in FIG. 1, the semiconductor structure 101 has a front surface 1011 and a back surface 1012.

The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMD layers may include low-k dielectric materials having k values, for example, lower than about 4.0 or even 2.0 disposed between such conductive features. In some embodiments, the ILD and IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). Interconnect structure electrically connects various active devices to form functional circuits within the semiconductor structure 101. The functions provided by such circuits may include logic structures, memory structures, processing structures, sensors, amplifiers, power distribution, input/output circuitry, or the like. One of ordinary skill in the art will appreciate that the above examples are provided for illustrative purposes only to further explain applications of various embodiments and are non-limiting. Other circuitry may be used as appropriate for a given application.

The semiconductor package 100 also has a bonding dielectric 101A over the semiconductor structure 101, surrounding a bonding metallization structure 101B. The bonding dielectric 101A includes dielectric materials 1013 such as oxides or nitrides. Dielectric and the metal lines expose at the top surface of the bonding metallization structure 101B, presenting a ready-to-bond surface appended to the semiconductor structure 101.

A through dielectric via 105 is positioned over the semiconductor structure 101 and the bonding dielectric 101A. In some embodiments, a plurality of through dielectric vias 105 is surrounded by dielectric 1053. Dielectric 1053 may or may not be identical to the dielectric 1013 of the bonding dielectric 101A. In the present embodiment, the through via 105 is surrounded by dielectric 1053 and hence the through dielectric via 105 may be referred to a through dielectric via (TDV). One end of the through dielectric via 105 in proximity to the bonding dielectric 101A is electrically coupling with the bonding metallization 101B, the other end of the through dielectric via 105 away from the bonding dielectric 101A is electrically coupling to a metallization 103 over the through dielectric via 105. The metallization 103 includes conductive features as described above. In addition, the conductive features of metallization 103 also include a passive device (PD) 110 such as an inductor or a capacitor. For example, in semiconductor package 100, the PD 110 entails a pattern of an inductor, electrically connecting to the through dielectric vias 105 through the conductive features in the metallization 103. In other embodiments, the PD 110 may directly contact with the through dielectric via 105.

Note a separation S between the PD 110 and the substrate portion 101' of the semiconductor structure 101 is at least 15 micrometer. By such a separation S, the induced current and the electric field generated by the PD 110 causes permissible, minimal effect to the active region in the substrate portion 101' of the semiconductor structure 101, even when the active region is under the projection of the PD 110, as shown in FIG. 1. If the separation S is less than about 15 micrometer, experimental data shows that the aforesaid adverse effect to active device may still persist. In the present disclosure, the arrangement of the PD 110 does not occupy any active region area in the semiconductor structure 101 and hence decreases the form factor of semiconductor structure 101 and manufacturing cost. Furthermore, since the PD 110 is electrically coupled to the semiconductor structures 101 and 102, the implementation of such PD 110 does not reduce any active region area in the semiconductor structure 102 as well.

Semiconductor package 100 further includes another semiconductor structure 102 over the semiconductor structure 101. In some embodiments, similar to semiconductor structure 101, semiconductor structure 102 includes a substrate portion 102' and a metallization portion 102" at the front surface of the substrate portion 102'. A bonding metallization structure 102A is over the top metal of the metallization 102" of the semiconductor structure 102. As discussed above, the semiconductor structure 102 includes a front surface 1021 and a back surface 1022. As depicted in FIG. 1, the front surface of the semiconductor structure 101 is bonded to the front surface of the semiconductor structure 102. In other words, the semiconductor package 100 demonstrates a face-to-face bonding. In some embodiments, since the bonding interface 104 (shown as dotted lines) includes both metal and dielectric materials, a hybrid bonding is adopted for bonding the semiconductor structures 101, 102. Details for hybrid bonding between semiconductor structures 101, 102 can be found in description for FIG. 4D. In other embodiments, the PD 110 can be implemented in the metallization 103 with a face-to-back bonding configuration between the semiconductor structure 101 and the semiconductor structure 102.

As shown in FIG. 1, the semiconductor structure 102 covers a first portion P1 of the semiconductor structure 101, whereas the through dielectric vias 105 covers a second portion P2 of the semiconductor structure 101. The semiconductor structure 102 and the bonding dielectric 102A together has a total thickness H'. H' is a distance measured from the back surface 1022 of the semiconductor structure 102 to the bonding metallization 101A of the semiconductor structure 101. Through dielectric vias 105 possesses a height H, measured from one end of the through dielectric vias 105 connecting with the metallization 103 to the bonding metallization 101A. In some embodiments, the height H is greater than the thickness H'. A difference $^{\Delta}H$ between the height H and the thickness H' is about a thickness of one metallization layer of. In some embodiments, the difference $^{\Delta}H$ is about 1 micrometer. Alternatively stated, the height H of the through dielectric via 105 is greater than the sum of the thicknesses of the semiconductor structure 102 and the bonding dielectric 102A due to the fact that after bonding the semiconductor structures 101, 102 and filling the gap over the second portion P2, an additional dielectric layer substantially equal to a thickens of $^{\Delta}H$ is deposited over the filled gap and the back side of the semiconductor structure 102, prior to the formation of the trench of the through dielectric via 105. Detailed manufacturing description can be found in paragraphs addressing FIG. 4G.

Still referring to FIG. 1, the through dielectric via 105 includes a plurality of through dielectric vias having a pitch, for example, of about 10 micrometers. As shown in FIG. 1, the PD 110 is positioned over the second through dielectric via 105 counting from a sidewall of the semiconductor structure 102. However, FIG. 1 is not suggesting that the PD 110 shall be positioned further away from the active region of the semiconductor structure 102. In other embodiments, positioning the PD 110 over the first through dielectric via 105 from the sidewall of the semiconductor structure 102 shall be encompassed within the contemplated scope of the present disclosure. People having ordinary skill in the art would understand that a device die in the semiconductor structure 102 contains a seal ring region in proximity to the circumference of the semiconductor structure 102, therefore, the active region in the substrate portion 102' of the semiconductor structure 102 is at least a seal ring region away from the PD 110 in the lateral direction. In some embodiments, a lateral separation between the active device in the semiconductor structure 102 and the PD 110 is at least 20 micrometer.

In some embodiments, the semiconductor structure 101 and the semiconductor structure 102 include different semiconductor chips or dies. For example, the semiconductor structure 101 can be a plain silicon wafer, a carrier, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor structure 102 can be a known good die (KGD), for example, which may have passed various electrical and/or structural tests. Semiconductor structure 102 may be a semiconductor die and could be any type of integrated circuit, such as an application processor, logic circuitry, memory, analog circuit, digital circuit, mixed signal, and the like.

In some embodiments, the semiconductor structure 101 has a greater device area than that of the semiconductor structure 102. However, in other embodiments, the semiconductor structure 101 may have an identical device area as the semiconductor structure 102, and the semiconductor structures 101, 102 are disposed with a transversal shift. The dielectric 1053 shown in FIG. 1 can either fills the gap caused by the semiconductor structure area difference or semiconductor structure alignment shift.

In some embodiments, the semiconductor structure 102 may include a different die than the semiconductor structure 101. For example, the semiconductor structure 102 may include a smaller die area and possess features with a critical dimension less than about 10 nanometer or 7 nanometer, while the semiconductor structure 101 may possess a greater die area, with or without active regions. The critical dimension in semiconductor structure 101 can be substantially greater than that in semiconductor structure 102. In some embodiments, the die in semiconductor structure 102 is a more advanced logic chip, compared to the die in semiconductor structure 101.

Additional features, such as input/output (I/O) contacts 107, passivation layers 108, solder balls 109, and/or under bump metallurgy (UBM) layers, may also be optionally formed over the metallization 103. The various features of semiconductor package 100 may be formed by any suitable method and are not described in further detail herein. Furthermore, the general features and configuration of semiconductor package 100 described above are but one example embodiment, and semiconductor package 100 may include any combination of any number of the above features as well as other features.

Figure 2:
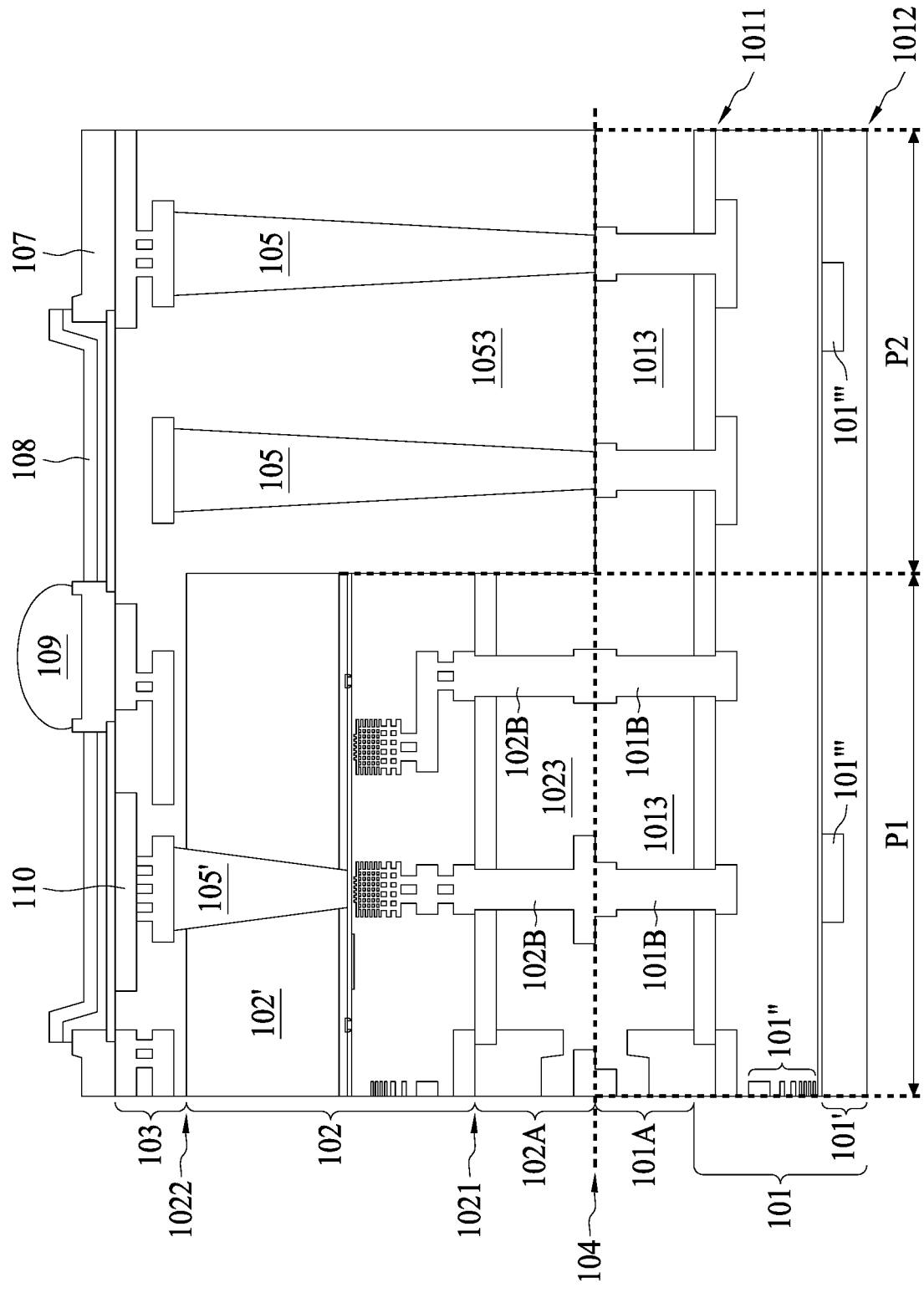
FIG. 2 is a cross sectional view of a semiconductor package, in accordance with some embodiments of the present disclosure.

Referring to FIG. 2, FIG. 2 is a cross sectional view of a semiconductor package 200, in accordance with some embodiments of the present disclosure. Identical numerals marked in the present disclosure refer to identical or substantially identical components and these components would not be repeated again for brevity. In FIG. 2, the PD 110 is positioned over the semiconductor structure 102, and an additional through silicon via 105' is electrically connecting the PD 110 with the active region of the semiconductor structure 102. In other words, the through silicon via 105' couples the PD 110, the semiconductor structure 102, and the semiconductor structure 101. Semiconductor structures 101 and 102 are also stacked in a face-to-face fashion, as previously described.

Figure 3:
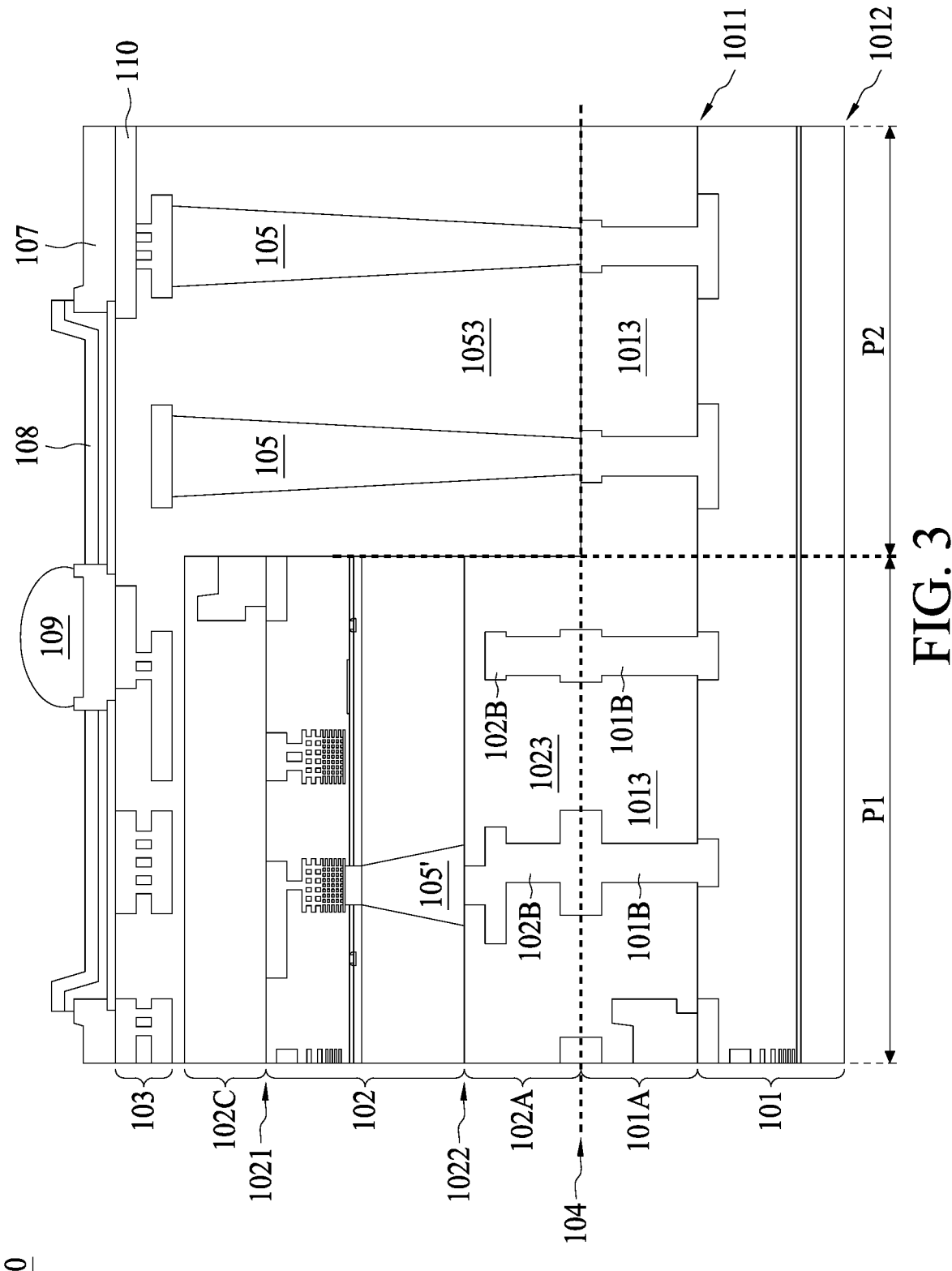
FIG. 3 is a cross sectional view of a semiconductor package, in accordance with some embodiments of the present disclosure.

Referring to FIG. 3, FIG. 3 is a cross sectional view of a semiconductor package 300, in accordance with some embodiments of the present disclosure. In FIG. 3, the PD 110 is positioned over the through dielectric via 105, and an additional through silicon via 105' is electrically connecting the active region of the semiconductor structure 102 and the bonding dielectric 101A of the semiconductor structure 101. In other words, the through silicon via 105' does not couple to the PD 110. However, the PD 110 is still electrically coupling with the active regions of the semiconductor structure 101 and the semiconductor structure 102. As depicted in FIG. 3, the through silicon via (TSV) 105' is surrounded by the substrate portion of the second semiconductor structure 102. Bonding dielectric 102A of the semiconductor structure 102 is formed at the back surface 1022, configured to hybrid bonded to the bonding dielectric 101A of the semiconductor structure 101. Semiconductor structures 101 and 102 are stacked in a face-to-back fashion, namely a front surface 1011 of the semiconductor structure 101 is bonded to a back surface 1022 of the semiconductor structure 102.

Figure 4A:
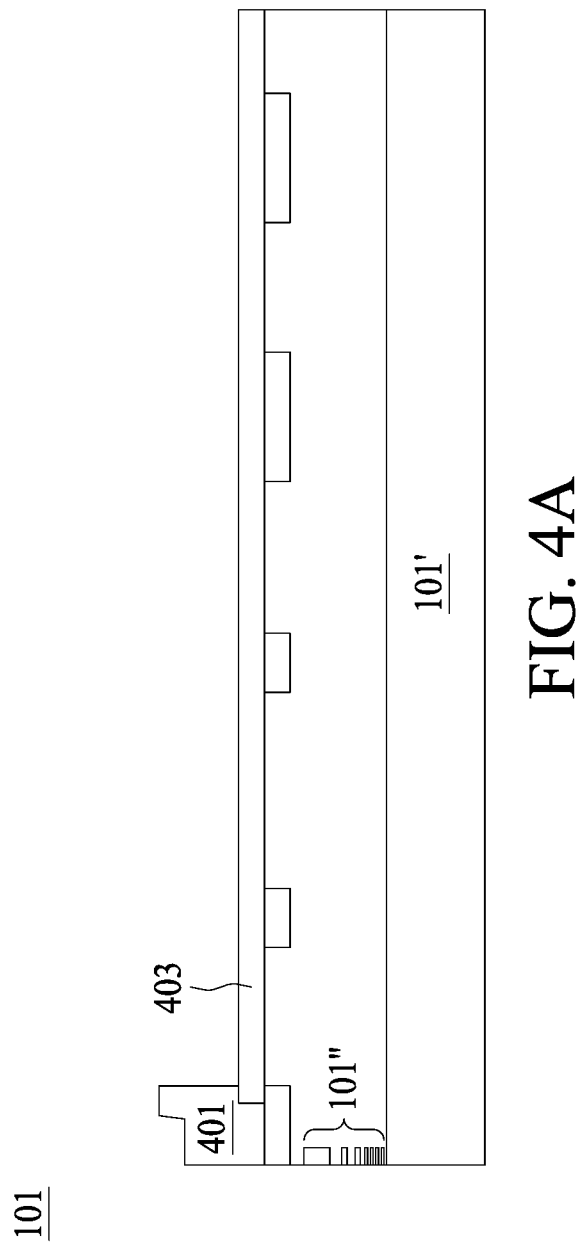
FIG. 4A to FIG. 4I show cross sectional views of a sequence of a method for manufacturing a semiconductor package, in accordance with some embodiments of the present disclosure.

FIG. 4A to FIG. 4I show cross sectional views of a sequence of a method for manufacturing a semiconductor package, in accordance with some embodiments of the present disclosure. In FIG. 4A, a semiconductor structure 101 is formed. A semiconductor structure 101 comprises a substrate portion 101' such as a semiconductor having one or more active devices formed therein. A die redistribution layer (RDL) is disposed on the substrate portion 101', forming a part of the metallization portion 101'' (FIG. 4A only shows the top metal of the metallization portion 101''). The metallization portion 101'' comprises one or more dielectric layers with conductive features disposed in the dielectric layers. The metallization portion 101'' is formed over the side of the substrate portion 101' having the active devices, with the conductive features connecting to the active devices on the substrate portion 101'. A conductive pad 401 connecting to the metallization portion 101'' is formed in an opening of a dielectric layer 403. In some embodiments, the conductive pad 401 is an aluminum pad.

Figure 4B:
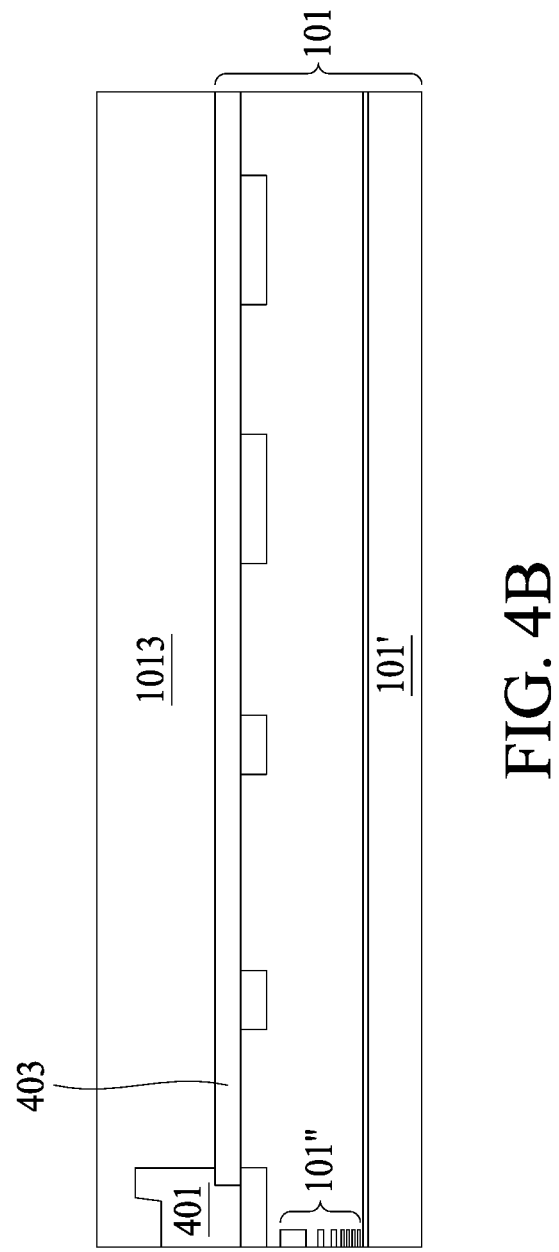
Figure 4C:
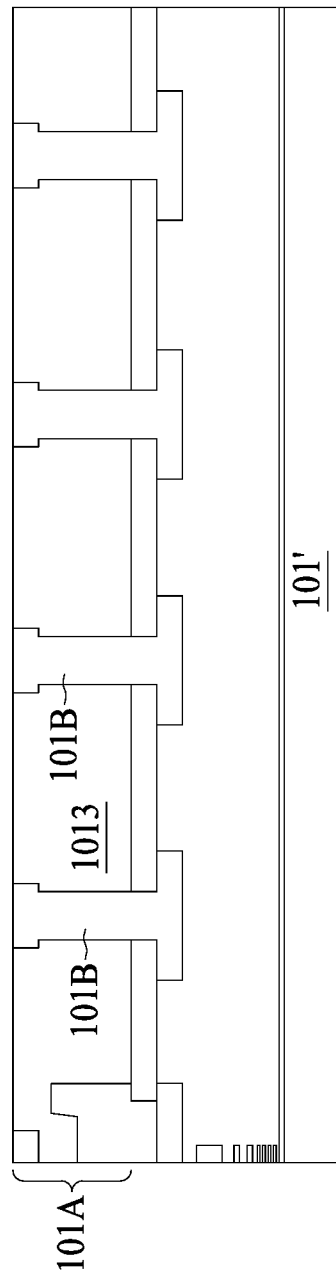

FIG. 4B and FIG. 4C depict the formation of the bonding metallization 101A. Following the formation of the conductive pad 401, a planarization operation is performed to level up a top surface of the semiconductor structure 101. For example, in FIG. 4B, a bonding dielectric 1013 is deposited over the conductive pad 401 and the dielectric layer 403. In such embodiments, the bonding dielectric 1013 may include oxide or nitride, such as silicon nitride, silicon oxide, silicon oxynitride, or another dielectric material, and is formed by CVD, PECVD, or another processes. The dielectric 1013 is then reduced or planarized by, for example, grinding, CMP, etching, or another process. For example, where dielectric 1013 is an insulating film such as an oxide or nitride, a dry etch or CMP is used to reduce or planarize the top surface of the bonding dielectric 1013. Bonding metallization structure 101B is formed in bonding dielectric 1013. In some embodiments, bonding metallization structure 101B is formed using a damascene process where openings are etched into bonding dielectric 1013, the openings are filled with a conductive material, and a planarization process is used to remove excess conductive material over bonding dielectric 1013. In another embodiment, a seed layer (not shown) is deposited, a mask having openings therein is used to define a pattern of bonding metallization structure 101B, and openings in the mask are filled with a conductive material (e.g., using an electroless plating process or the like). Subsequently, the mask and excess portions of the seed layer are removed, and a dielectric material may be formed around the resulting bonding metallization structure 101B. The dielectric material may comprise a same material as bonding dielectric 1013 and is also referred to as bonding dielectric 1013 hereinafter. In some embodiments, the bonding metallization structure 101B includes a bond pad metals which extends laterally in the bonding dielectric 1013 and bond pad vias which extends vertically in the bonding dielectric 1013 and connects to the bond pad metals. As shown in FIG. 4C, a top surface of the semiconductor structure 101 exposes a portion of the bonding metallization 101b such as bond pad metals and a portion of the bonding dielectric 1013.

Figure 4D:
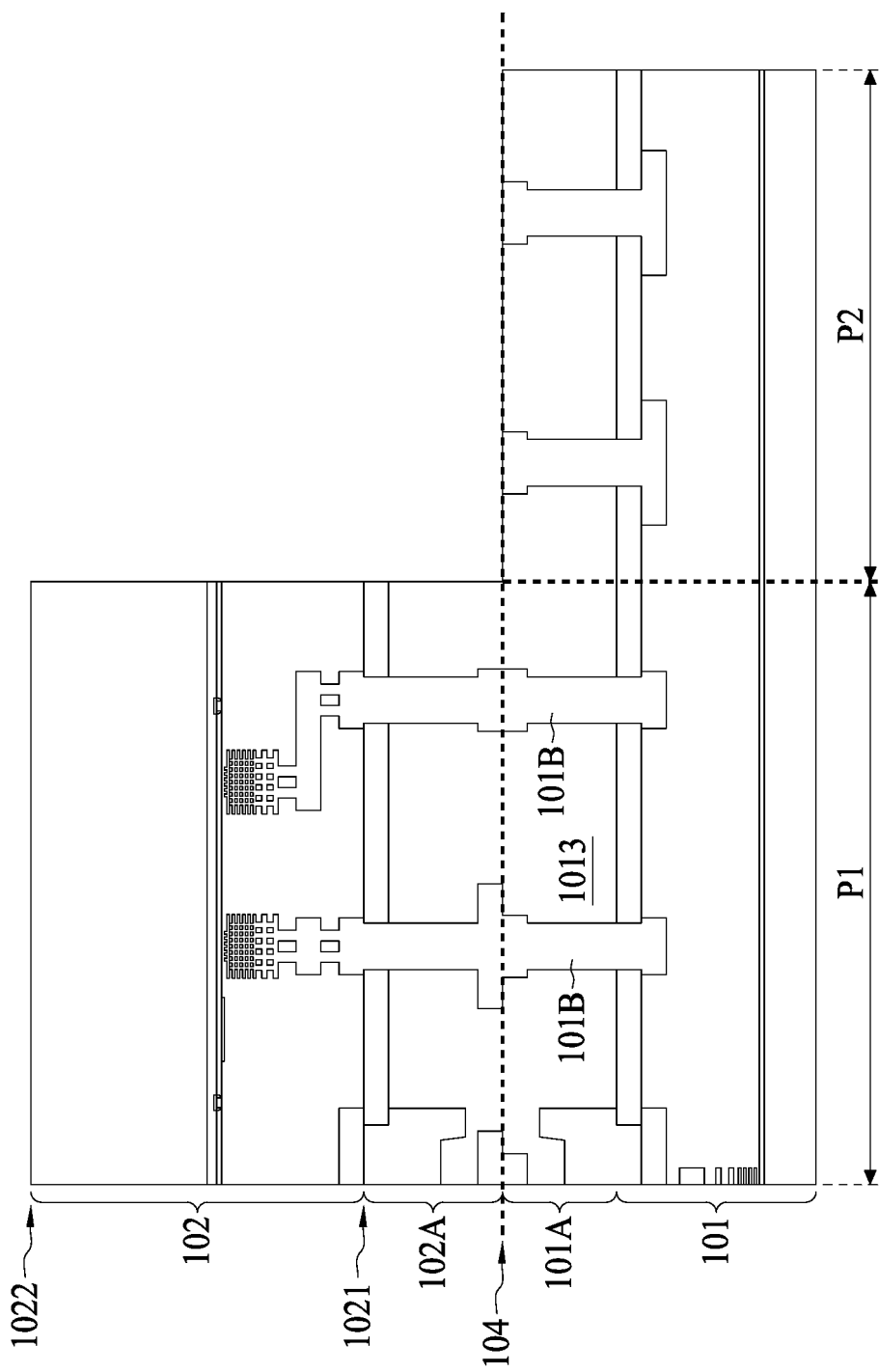

FIG. 4D depicts a bonding operation of the semiconductor structure 101 and the semiconductor structure 102. Semiconductor structure 101 and semiconductor structure 102 are bonded by bonding dielectrics 1013, 1023 and bonding metallization 101B, 102B using a hybrid bonding process, for example, to form conductor-to-conductor bonds as well as dielectric-to-dielectric bonds. Thus, the need for solder joints (or other external connectors) for bonding dies in embodiment packages is reduced, which reduces manufacturing defects and cost. In some embodiments, semiconductor structure 101 and semiconductor structure 102 may be substantially similar. In a hybrid bonding process, conductive features such as bonding metallization 101B of semiconductor structure 101 and conductive features such as bonding metallization 102B of semiconductor structure 102 may be aligned and contacted. Bonding dielectrics 1013, 1023 such as ILD/IMD layers of semiconductor structure 101 and semiconductor structure 102, respectively, may also be contacted. Subsequently an annealing operation may be performed to directly bond the conductive and dielectric materials together. Bonding interface 104 is depicted in dotted lines as an illustrated visual guide. In some embodiments, as shown in FIG. 4D, the semiconductor structure 102 possesses a smaller footprint than the semiconductor structure 101. After bonding, the semiconductor structure 102 is bonded to the semiconductor structure 101 by a first portion P1, thus creating an empty gap over a second portion P2 of the semiconductor structure 101.

Figure 4E:
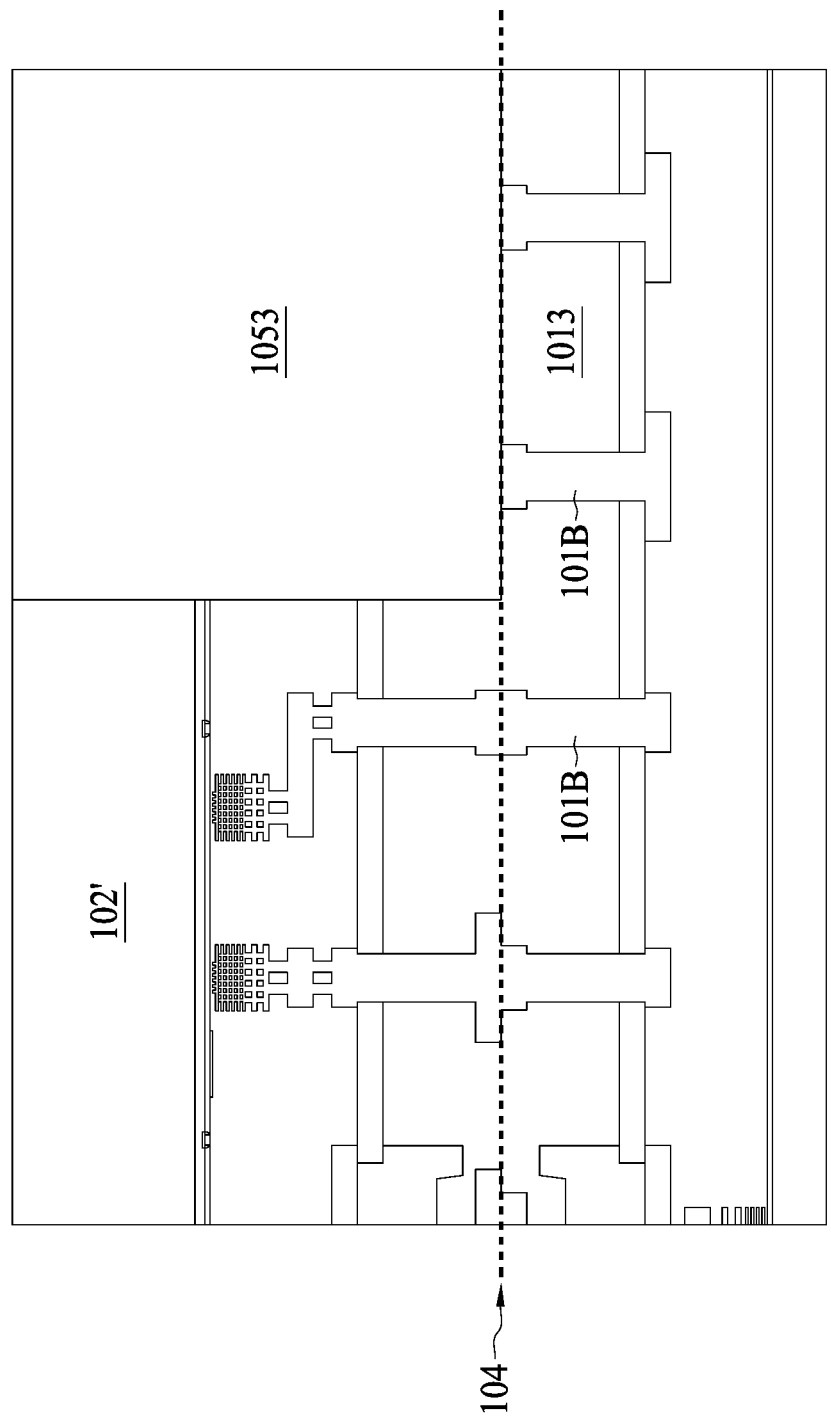

FIG. 4E shows a gap filling operation to level the bonded semiconductor structure 101 and semiconductor structure 102. The dielectric 1053 is formed around the semiconductor structure 102 and on bonding dielectric 1013 and bonding metallization 101B. In some embodiments, the dielectric 1053 is deposited over the back surface of the substrate portion 102' and then followed by a planarization operation. The dielectric 1053 may be deposited using a CVD process, an ALD process, a PVD process, another applicable process, or a combination thereof.

In some embodiments, dielectric 1053 is formed around semiconductor structure 102. Materials of dielectric 1053 (hereinafter "dielectric material") extend along sidewalls of semiconductor structure 102, and in a top-down view (not shown), dielectric material may encircle semiconductor structure 102. Dielectric material may comprise a molding compound, a polymer material, a dielectric material, combinations thereof, or the like. The exact material used for dielectric 1053 may be selected based on the thickness of semiconductor structure 102. For example, a thinner semiconductor structure 102 may allow for a dielectric material to be used for dielectric 1053, which may advantageously provide improved process control, lower manufacturing costs, and reduced co-efficient of thermal expansion (CTE) mismatch, which advantageously reduces warpage in the resulting package. As another example, a polymer material or even a molding compound may be used for a thicker semiconductor structure 102 in order to provide improved structural support.

In embodiments where dielectric material comprises dielectric material, dielectric material may be an oxide, nitride, combinations thereof, or the like. In such embodiments, the oxide or nitride insulating film may include a silicon nitride, silicon oxide, silicon oxynitride, or another dielectric material, and is formed by CVD, PECVD, or another process.

In embodiments where dielectric material comprises a molding compound or a polymer, dielectric material may be shaped or molded using for example, a mold (not shown), which may have a border or other feature for retaining dielectric material when applied. Such a mold may be used to pressure mold the dielectric material around the die 102A to force dielectric material into openings and recesses, eliminating air pockets or the like in dielectric material. Subsequently, a curing process is performed to solidify dielectric material. In such embodiments, dielectric material comprises an epoxy, a resin, a moldable polymer such as PBO, or another moldable material. For example, dielectric material is an epoxy or resin that is cured through a chemical reaction or by drying. In another embodiment, the dielectric material is an ultraviolet (UV) cured polymer. Other suitable processes, such as transfer molding, liquid encapsulant molding, and the like, may be used to form dielectric material.

After the dielectric 1053 is formed, the dielectric 1053 is reduced or planarized by, for example, grinding, a chemical-mechanical polish (CMP), etching or another process. In some embodiments, the dielectric 1053 extends over the semiconductor structure 102 after planarization, and in other embodiments, the dielectric 1053 is reduced so that the semiconductor structure 102 is exposed. The substrate portion 102' is, in some embodiment, thinned or reduced in the same process as the dielectric 1053, resulting in a die 102 backside surface that is substantially planar with the molding compound surface. A thinning process is applied to the substrate portion 102' in order to reduce an overall thickness thereof to a desired thickness. In some embodiments, desired thickness may be less than about 100 μm or less than about 10 μm, for example. In other embodiments, desired thickness may be different depending on device design. The thinning process may include applying a mechanical grinding process, a chemical mechanical polish (CMP), an etch back process, or the like to the substrate portion 102' of semiconductor structure 102.

Figure 4F:
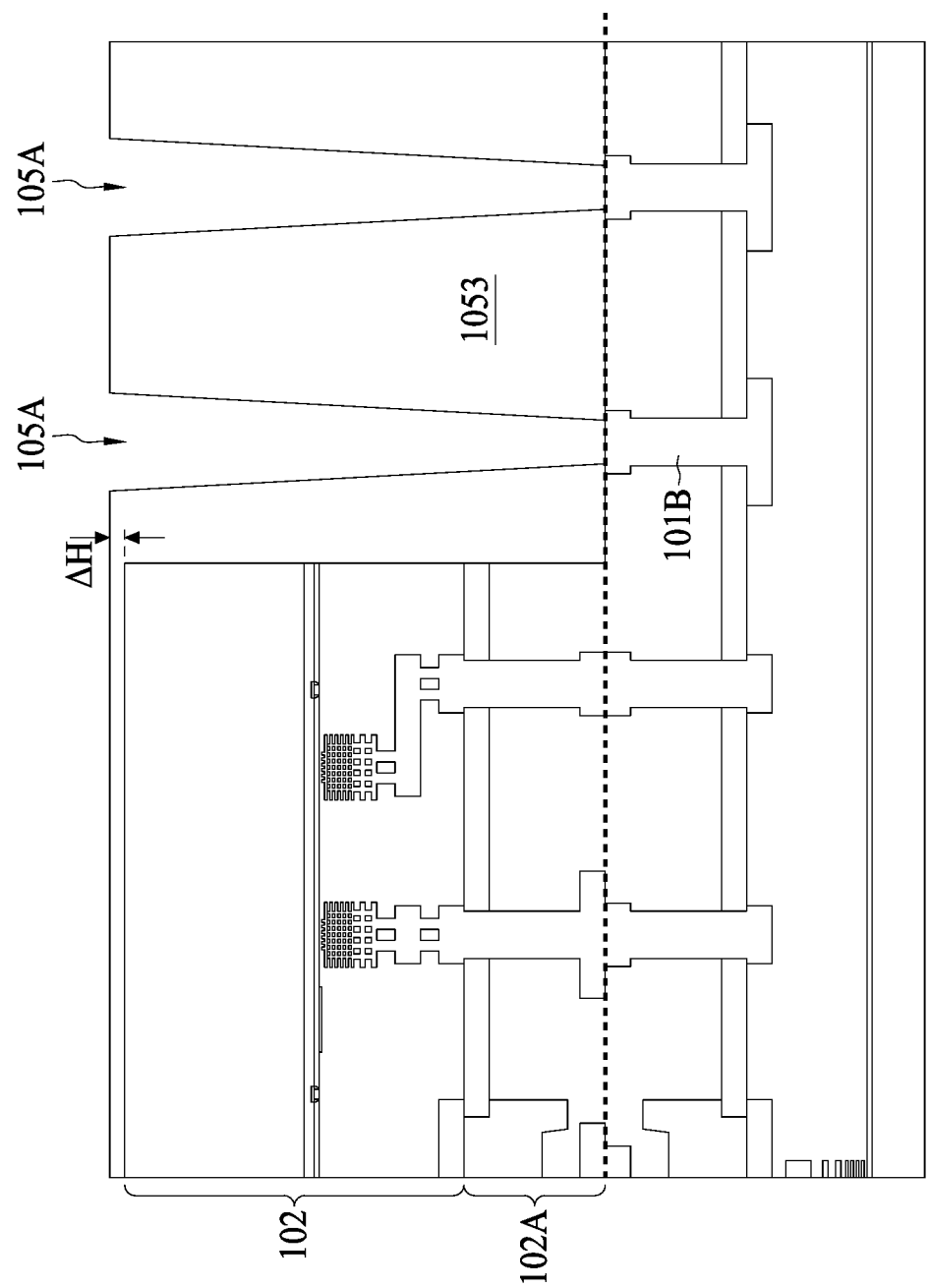

FIG. 4F depicts a through dielectric via (TDV) trench 105A formation. Following the planarization and thinning operation described in FIG. 4E, a layer of dielectric material is deposited over the dielectric 1053 and the thinned substrate portion 102'. As previously discussed, the thickness of the dielectric material is approximately $^\Delta H$, which is the thickness difference between the TDV 105 and the sum of the semiconductor structure 102 and its bonding dielectric 102A.

Via openings 105A are formed through the dielectric 1053 to expose the bonding metallization 101B. In an embodiment, the via openings 105A are etched as below. Forming a first mask (not shown) over the newly deposited dielectric layer possessing a thickness approximately of $^\Delta H$. In such an embodiment, the first mask is formed over the dielectric 1053 and is patterned to form openings. The first mask is, in some embodiments, a photoresist that is deposited, exposed and developed. The openings in the first mask are aligned over conductive elements such as bonding metallization 101B in the bonding dielectric 101A. Via openings 105A that are adjacent to, and not disposed over, the semiconductor structure 102 extend partially through the dielectric 1053.

Figure 4G:
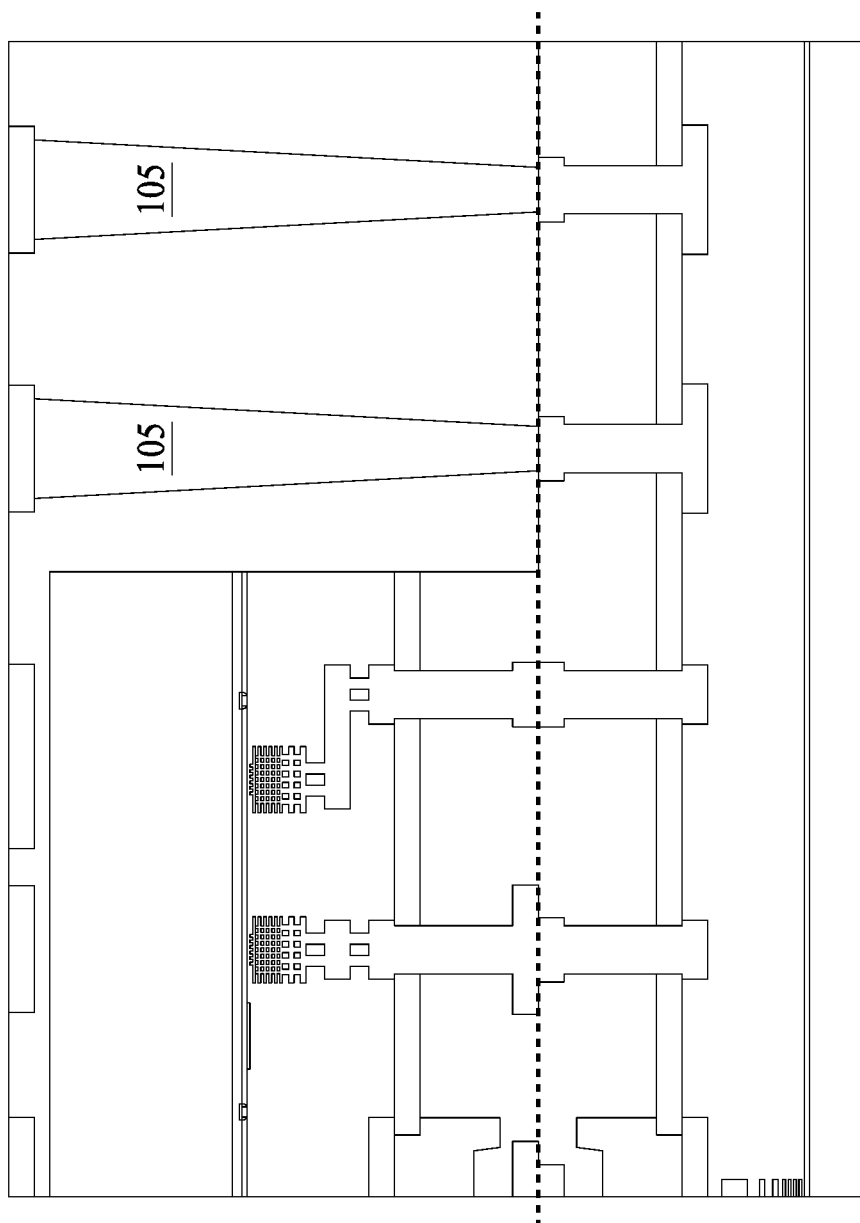
Figure 4H:
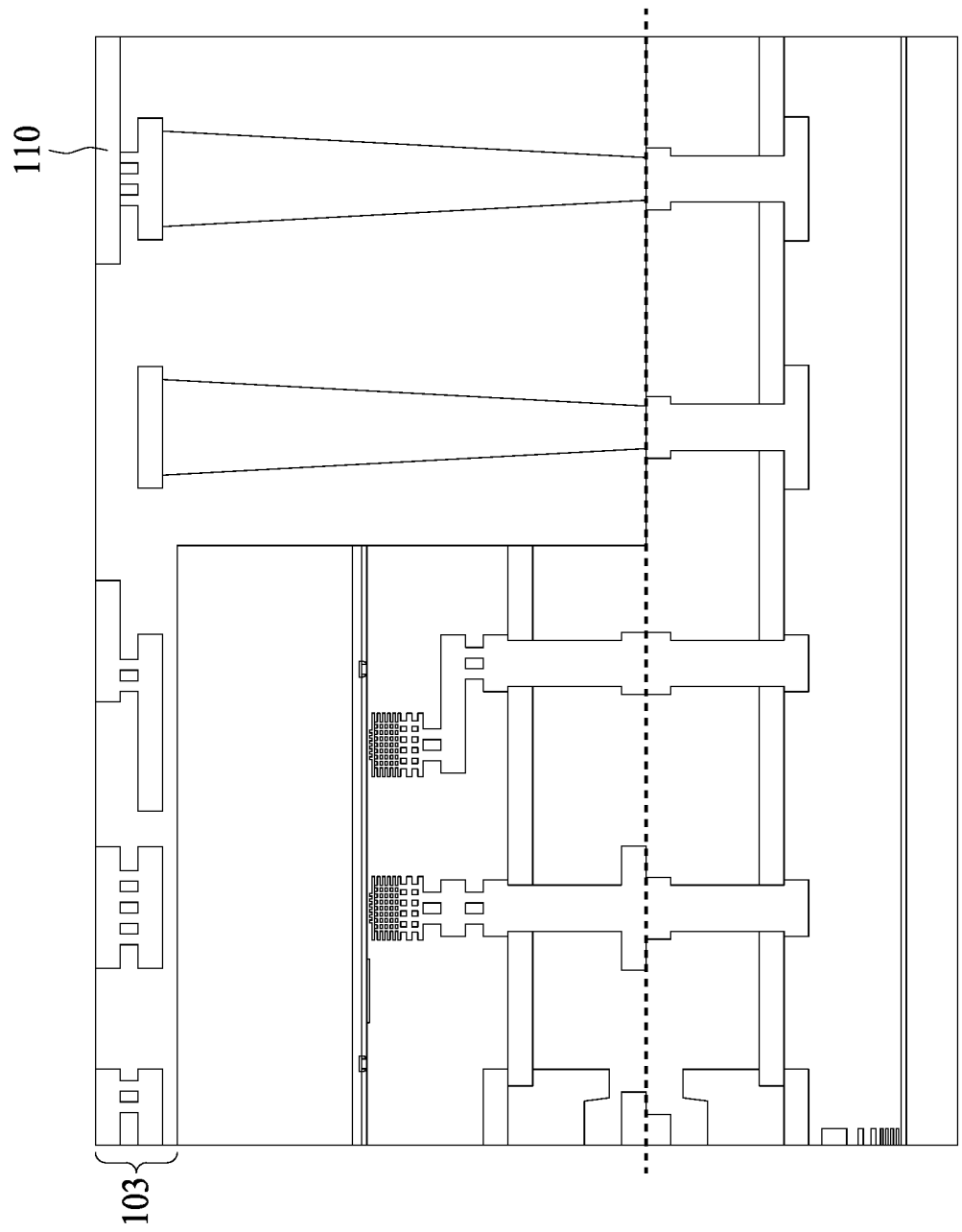

FIG. 4G and FIG. 4H show a formation of a metallization structure 103 over the semiconductor structure 102 and the TDVs 105. In FIG. 4G, the via openings 105A are filled with conductive materials by, for example, electroplating or the like, to form vias TDVs 105. A barrier layer, seed layer and conductive material layer are sequentially formed in the via openings 105A, and then reduced by CMP or the like to level the top surface of the TDVs 105 so as to align with the top surface of the dielectric layer over the semiconductor structure 102 besides the TDVs 105. A first layer of the metallization structure 103 is formed over the top surface of the TDVs 105. As previously described, similar to the bonding dielectric 101A and bonding metallization 101B, the metallization structure 103 also includes the formation of inter-layer dielectric (ILD) and/or inter-metal dielectric (IMD) layers containing conductive features (e.g., conductive lines and vias comprising copper, aluminum, tungsten, combinations thereof, and the like) by using any suitable method previously described.

As depicted in FIG. 4G, a first layer of conductive lines are formed in the dielectric. Subsequently, a first layer of conductive vias are formed over the first layer of conductive lines with proper alignment and lithography operations. In FIG. 4H, a second layer of conductive lines are formed. Specifically, in this embodiment, the second layer of conductive lines comprises a passive device (PD) 110 such as an inductor or a capacitor. The pattern of the second layer (or the subsequent layers) of conductive lines are designed to have a coiled shape or an overlap that constitutes an inductor or a capacitor electrically coupled to at least the first semiconductor structure 101 through TDVs 105. In some embodiments, the PD 110 is further coupled to the second semiconductor structure 102 through the hybrid bonding conductive route. However, the PD 110 is not limited to be formed in or above the second layer of conductive lines. In some embodiments, PD 110 may also be formed in the first layer of conductive lines, directly interfacing with the TDVs 105.

Figure 4I:
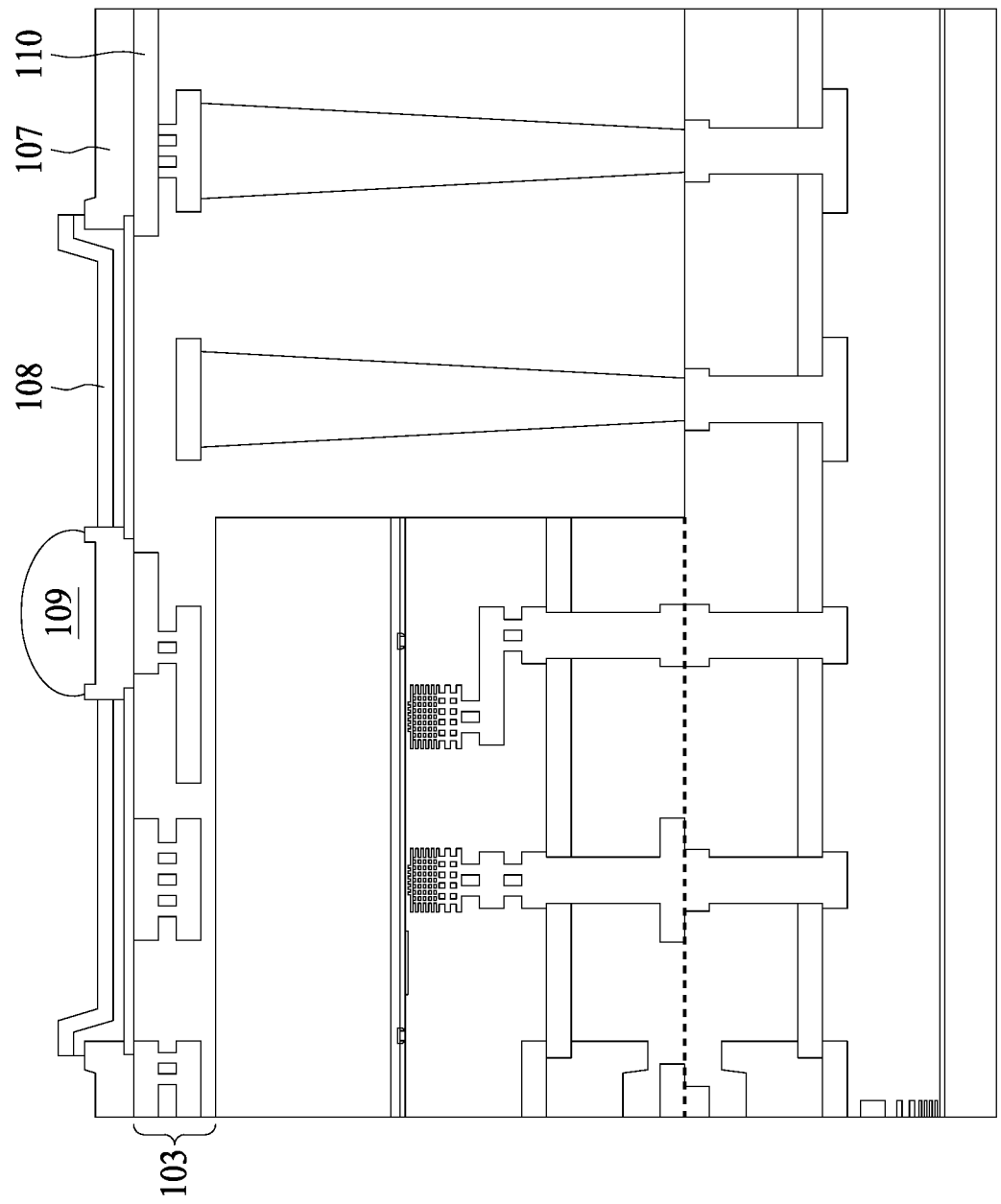

FIG. 4I depicts subsequent external terminal formation. For example, conductive pillar, contact pad 107, and solder ball 109 surrounded by the passivation layer 108 are formed over the metallization structure 103.

Figure 5A:
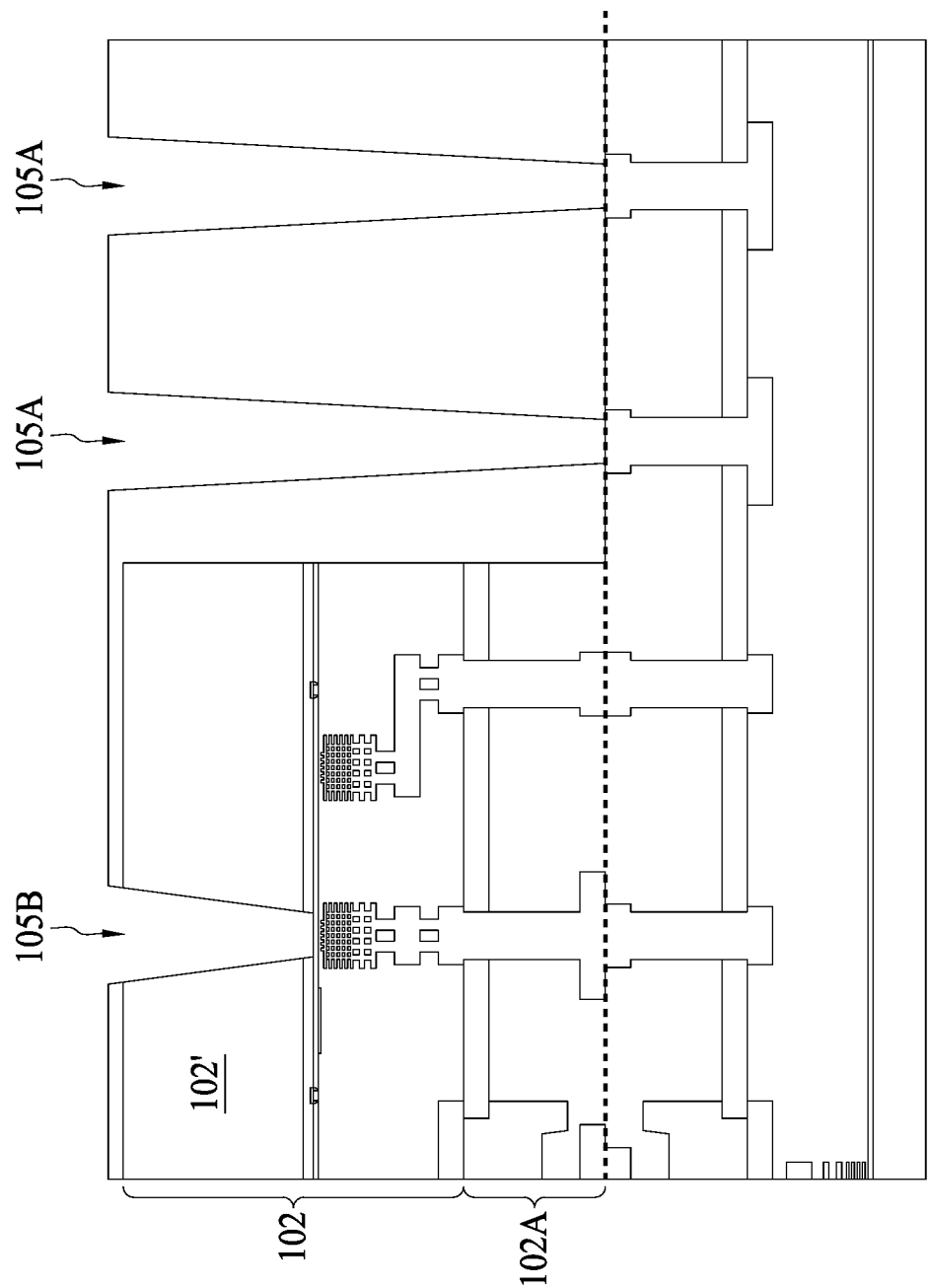
FIG. 5A to FIG. 5B show cross sectional views of a selected sequence of a method for manufacturing a semiconductor package, in accordance with some embodiments of the present disclosure.
Figure 5B:
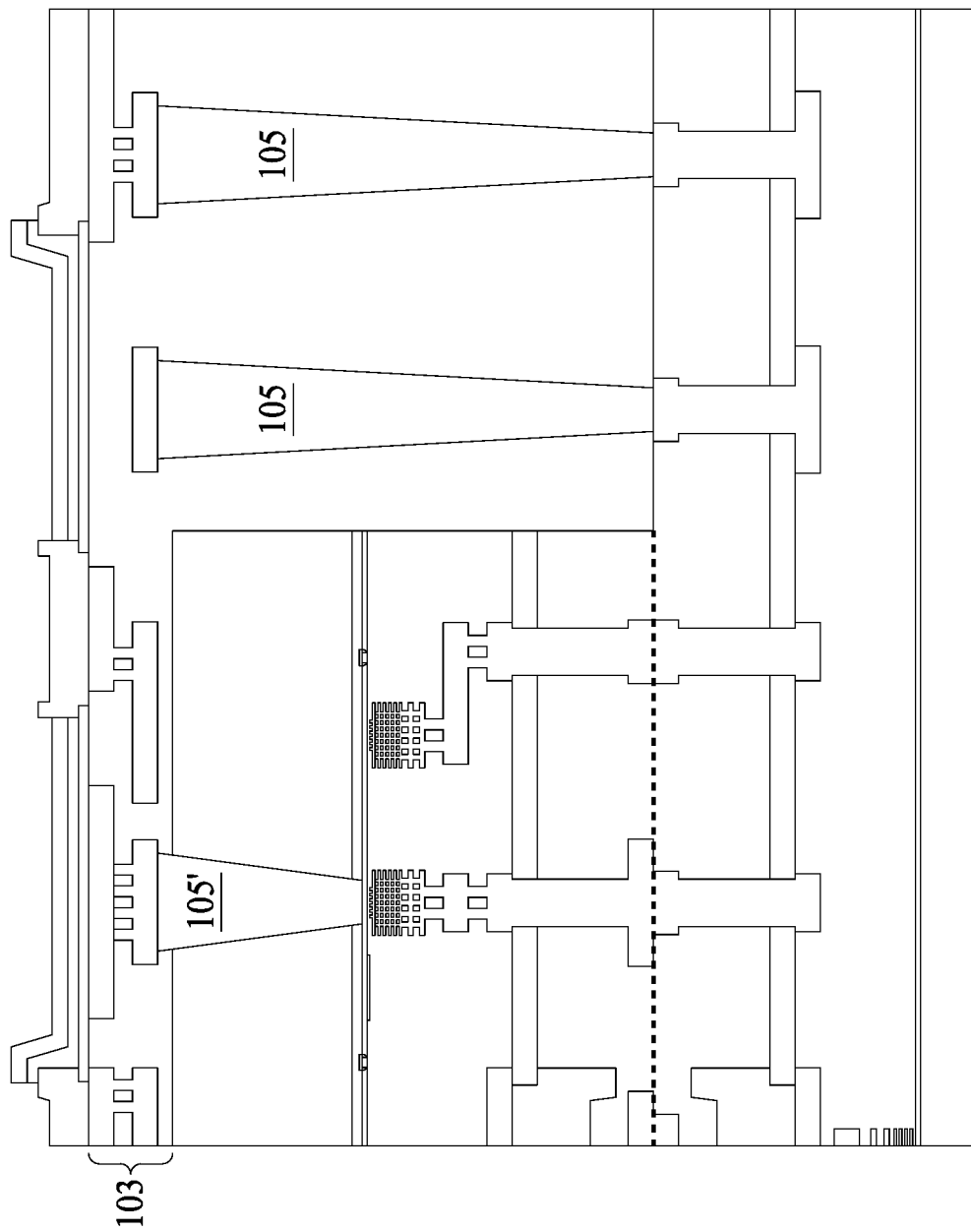

FIG. 5A to FIG. 5B show cross sectional views of a selected sequence of a method for manufacturing a semiconductor package 200, in accordance with some embodiments of the present disclosure. The manufacturing operations of semiconductor package 200 are similar to those described in FIG. 4A to FIG. 4I except an additional operation to form a through silicon via 105' (TSV) in the substrate portion 102' of the semiconductor structure 102. In some embodiments, the TSV trench 105B is formed simultaneously with the TDV trench 105A shown in FIG. 4F by preparing corresponding mask openings. Following the TDV 105' and TSV 105 formation, the metallization structure 103 comprising a passive device (PD) over the TSV 105' is formed over the second semiconductor structure 102 and the TDVs 105. As shown in FIG. 5B, the subsequent external terminals are formed over the TDVs 105 and the TSV 105'.

Figure 6A:
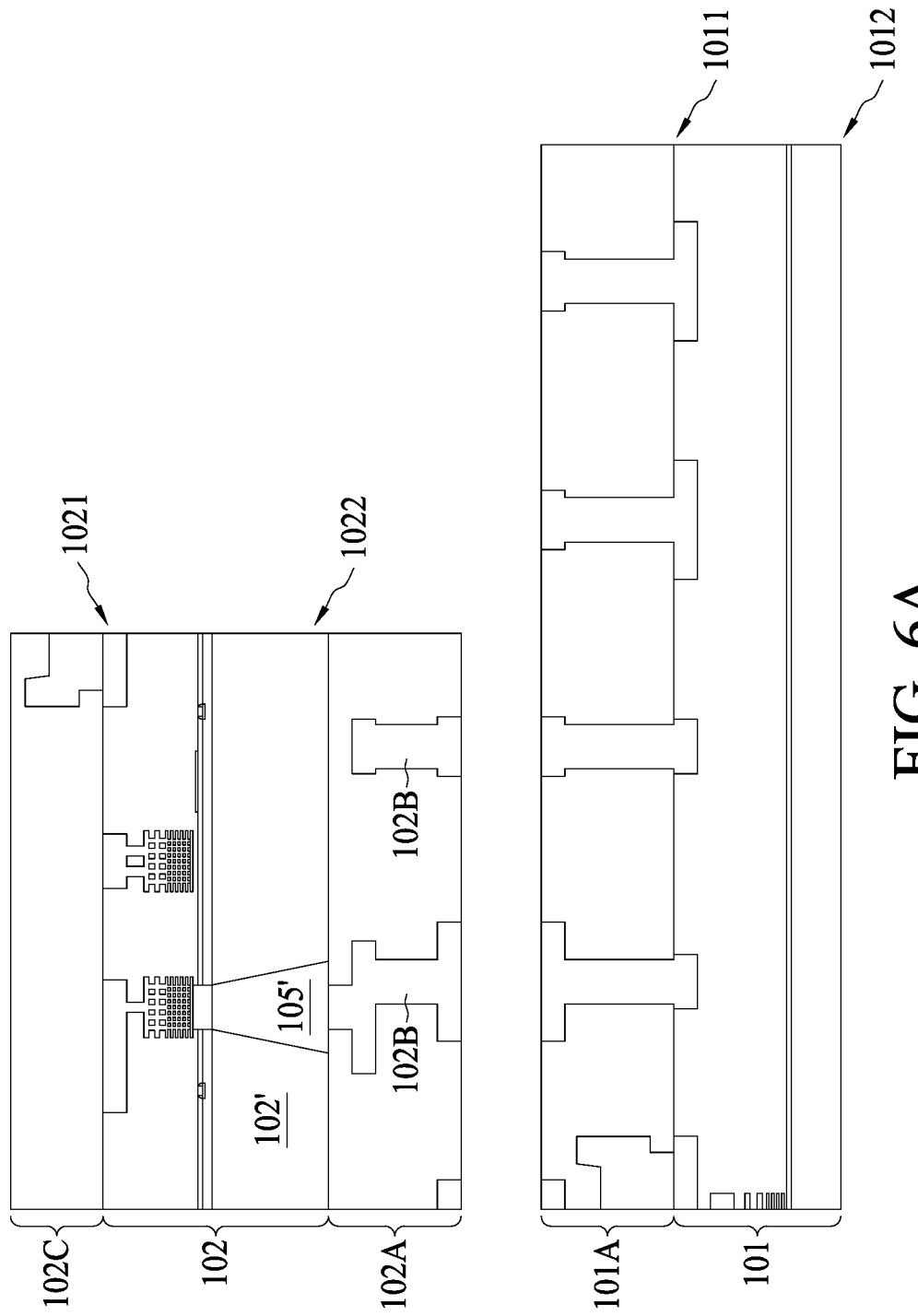
FIG. 6A to FIG. 6C show cross sectional views of a selected sequence of a method for manufacturing a semiconductor package, in accordance with some embodiments of the present disclosure.
Figure 6B:
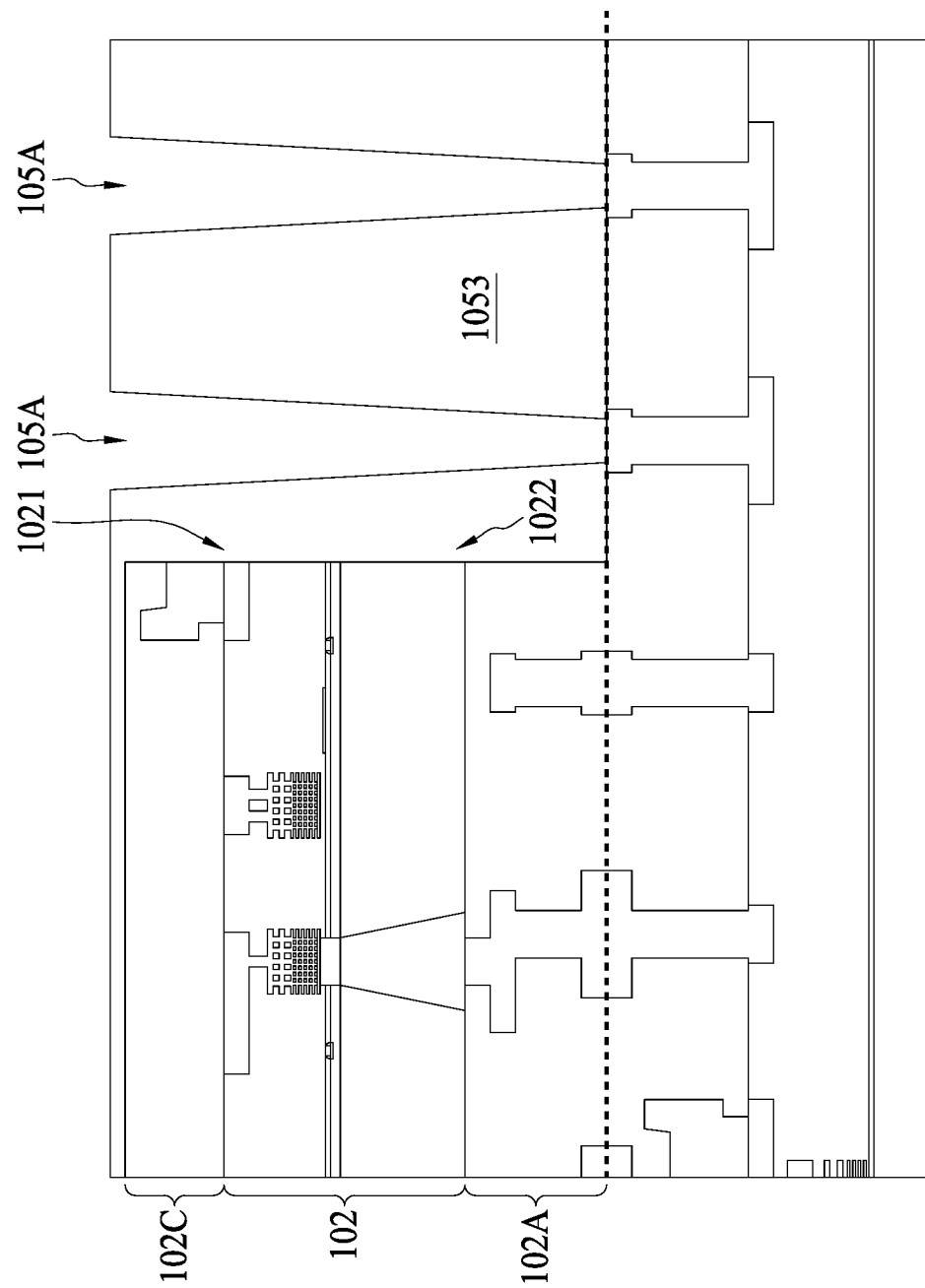
Figure 6C:
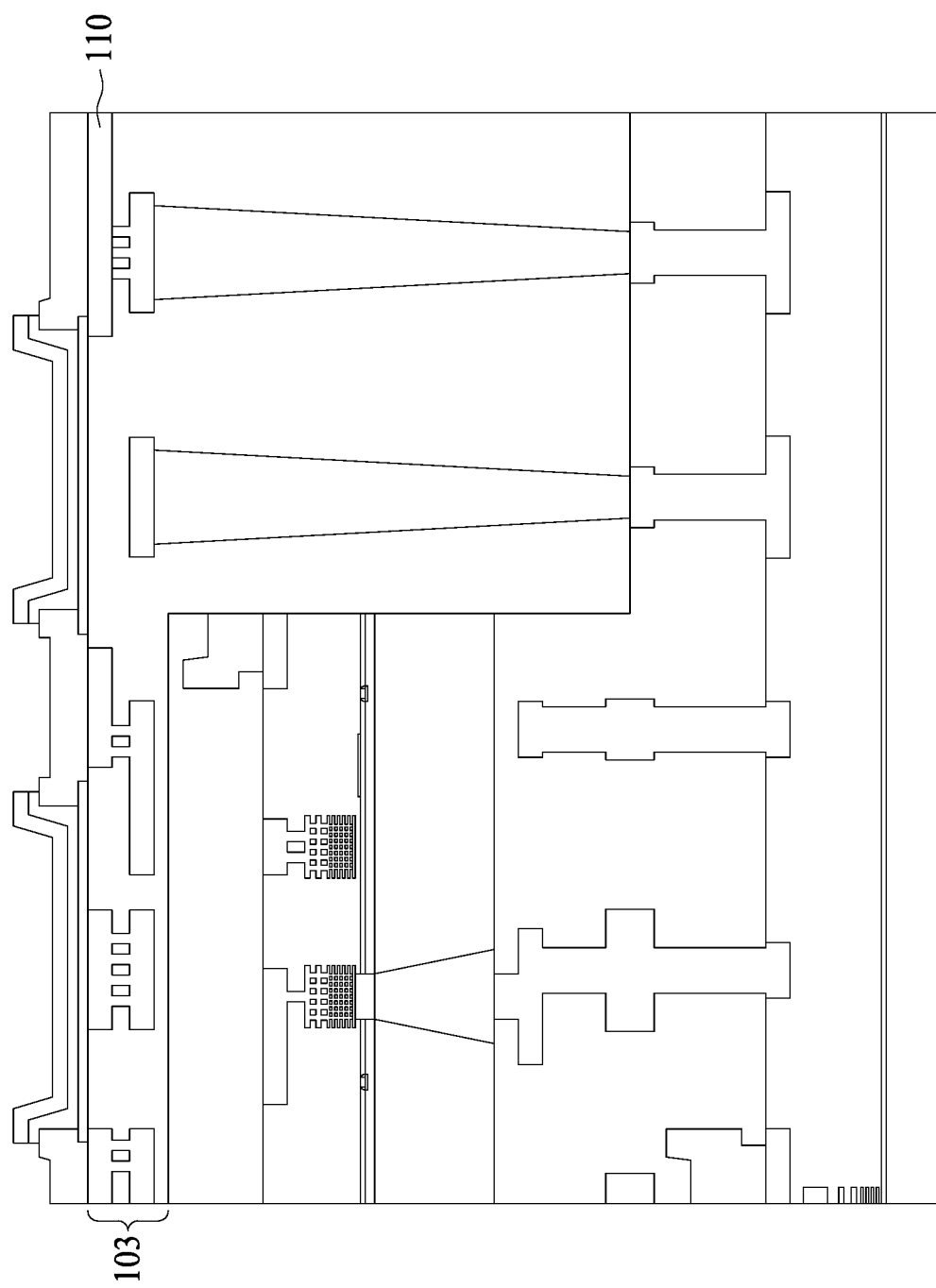

FIG. 6A to FIG. 6C show cross sectional views of a selected sequence of a method for manufacturing a semiconductor package 300, in accordance with some embodiments of the present disclosure. In FIG. 6A, semiconductor structures 101, 102 are separately depicted prior to the bonding operation. In this embodiment, the back surface 1022 of the semiconductor structure 102 is facing the front surface 1011 of the semiconductor structure 101. The bonding metallization 102A is then formed at the back surface 1022 of the semiconductor structure 102. A through silicon via (TSV) 105' is pre-formed in the substrate portion 102' before the formation of the bonding metallization 102B and the bonding dielectric 102A surrounding the bonding metallization 102B. One end of the TSV 105' is aligned with the bonding metallization 102B. A contact layer 102C of the semiconductor structure 102 is further formed over the front side 1021 interconnect of the semiconductor structure 102.

As depicted in FIG. 6B, after the bonding dielectric 102A of the semiconductor structure 102 being hybrid bonded to the bonding dielectric 101A of the semiconductor structure 101 and the gap being filled as described in FIG. 4E, a layer of dielectric is further deposited over the contact layer 102C and the dielectric 1053, followed by the TDV trench 105' formation. FIG. 6C depicts subsequent metallization structure 103, PD 110, and external terminal formation as previously described.

Some embodiments of the present disclosure provide a semiconductor package. The semiconductor package includes a first semiconductor structure, a first bonding dielectric over the first semiconductor structure and surrounding a first bonding metallization structure, a through via over the first bonding dielectric, and a passive device electrically coupled to the through via. The first metallization structure is electrically coupled to the through via.

Some embodiments of the present disclosure provide a multi-chip semiconductor package. The multi-chip semiconductor package includes a first die having a front side, a second die over a first portion of the front side, a through dielectric via (TDV) structure over a second portion of the front side and adjacent to the second die, and a metallization structure over the second die and the TDV structure. The metallization structure comprises a passive device.

Some embodiments of the present disclosure provide a method for manufacturing a semiconductor package. The method includes providing a first die, forming a first bonding metallization over the first die, bonding a second die with the first die through the first bonding metallization, wherein the second die partially covers the first die thereby forming a gap over an uncovered portion of the first die, filling the gap over the first die with dielectric, forming a through dielectric via (TDV) in the filled gap, and forming a passive device over the second die and the TDV.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package, comprising:
    a first semiconductor structure, comprising an active region in a first substrate portion, wherein the active region comprises at least one of a transistor, a diode, and a photodiode;
    a first bonding metallization over the first semiconductor structure;
    a first bonding dielectric over the first semiconductor structure, surrounding and directly contacting the first bonding metallization;
    a second semiconductor structure, comprising a second substrate portion, the second substrate portion having a front surface facing the first bonding metallization and a back surface opposite to the front surface;
    a second bonding metallization at the front surface of the second semiconductor structure;
    a second bonding dielectric surrounding and directly contacting the second bonding metallization, and the second bonding dielectric directly contacting the first bonding dielectric;
    a conductive through via penetrating the second substrate portion, extending from the front surface to the back surface of the second substrate portion; and
    a passive device directly over the back surface of the second substrate portion and electrically connecting to the conductive through via and the first metallization.

2. The semiconductor package of claim 1, wherein a separation between the active region and the passive device is at least 15 micrometer.

3. The semiconductor package of claim 1, wherein the second bonding metallization and the second bonding dielectric are hybrid bonded to the first bonding metallization and the first bonding dielectric, respectively.

4. The semiconductor package of claim 1, wherein the second semiconductor structure is a known good die.

5. The semiconductor package of claim 1, further comprising a metallization structure over the second semiconductor structure and the conductive_through via, the passive device being a portion of the third metallization structure.

6. The semiconductor package of claim 5, wherein the conductive through via is a conductive through silicon via (TSV) electrical coupling the metallization structure with the first bonding metallization and the second bonding metallization.

7. A semiconductor package, comprising:
a first semiconductor structure, comprising an active region in a first substrate portion, wherein the active region comprises at least one of a transistor, a diode, and a photodiode;
a first bonding metallization over the first semiconductor structure;
a first bonding dielectric surrounding and directly contacting the first bonding metallization;
a second semiconductor structure, comprising a second substrate portion, the second substrate portion having a front surface facing the first bonding metallization and a back surface opposite to the front surface;
a second bonding metallization at the front surface of the second semiconductor structure;
a second bonding dielectric surrounding and directly contacting the second bonding metallization, and the second bonding dielectric directly contacting the first bonding dielectric;
a first conductive through via penetrating the second substrate portion, extending from the front surface to the back surface;
a metallization structure over the back surface of the second substrate portion, the metallization structure comprising a passive device electrically connecting to the first conductive through via and the first metallization.

8. The semiconductor package of claim 7, wherein the first semiconductor structure comprises a front surface facing the second bonding metallization and the second bonding dielectric.

9. The semiconductor package of claim 7, wherein the second semiconductor structure is under a projection of the passive device.

10. The semiconductor package of claim 9, wherein the first conductive through via is under a projection of the passive device.

11. The semiconductor package of claim 7 further comprising a plurality of second conductive through vias adjacent to the second semiconductor structure, a pitch between adjacent second conductive through vias is from about 5 micrometer to about 10 micrometer.

12. The semiconductor package of claim 7, wherein the first semiconductor structure comprises a greater area than an area of the second semiconductor structure.

13. The semiconductor package of claim 11, wherein the second conductive_through via comprises a height greater than a thickness of the second semiconductor structure.

14. The semiconductor package of claim 7, further comprising a solder ball over the metallization structure.

15. The semiconductor package of claim 7, wherein a critical dimension of the second semiconductor structure is smaller than a critical dimension of the first semiconductor structure.

16. A semiconductor package, comprising:
a first semiconductor structure, comprising an active region in a first substrate portion, wherein the active region comprises at least one of a transistor, a diode, and a photodiode;
a first bonding metallization over the first semiconductor structure;
a first bonding dielectric surrounding and directly contacting the first bonding metallization;
a second semiconductor structure comprising a second substrate portion, the second substrate portion having a front surface facing the first bonding metallization and a back surface opposite to the front surface;
a second bonding metallization at the front surface of the second semiconductor structure;
a second bonding dielectric surrounding and directly contacting the second bonding metallization, and the second bonding dielectric directly contacting the first bonding dielectric;
a conductive through silicon via (TSV) over the first bonding dielectric and penetrating the second substrate portion, extending from the front surface to the back surface of the second substrate portion; and
a passive device directly over the conductive TSV and the back surface of the second substrate portion and electrically connecting to the conductive TSV and the first metallization.

17. The semiconductor package of claim 16, further comprising a dielectric over the first semiconductor structure and adjacent to the second semiconductor structure, a conductive through dielectric via (TDV) penetrating the dielectric.

18. The semiconductor package of claim 17, wherein a height of the conductive TDV is greater than a thickness of second semiconductor structure.

19. The semiconductor package of claim 16, wherein a thickness of the second semiconductor structure is less than about 10 micrometer.

20. The semiconductor package of claim 16, wherein a separation between the active region and the passive device is at least 15 micrometer.

* * * * *